United States Patent
Matsumura et al.

(10) Patent No.: US 7,135,414 B2
(45) Date of Patent: Nov. 14, 2006

(54) METHOD FOR PRODUCING MULTICRYSTALLINE SILICON SUBSTRATE FOR SOLAR CELLS

(75) Inventors: Michio Matsumura, Toyonaka (JP); Kazuya Tujino, Toyonaka (JP)

(73) Assignee: Kansai Technology Licensing Organization Co., Ltd., Kyoto (JP)

( * ) Notice: Subject to any disclaimer, the term of this patent is extended or adjusted under 35 U.S.C. 154(b) by 38 days.

(21) Appl. No.: 11/002,657

(22) Filed: Dec. 3, 2004

(65) Prior Publication Data

US 2005/0101153 A1  May 12, 2005

Related U.S. Application Data

(63) Continuation of application No. PCT/JP03/07176, filed on Jun. 6, 2003.

(30) Foreign Application Priority Data

Jun. 6, 2002 (JP) .............................. 2002-165307
Jan. 10, 2003 (JP) .............................. 2003-004382

(51) Int. Cl.
*H01L 21/302* (2006.01)
(52) U.S. Cl. .................... 438/745; 438/678; 438/749
(58) Field of Classification Search ................ 438/745, 438/750, 753, 754, 571, 575, 580, 678, 749
See application file for complete search history.

(56) References Cited

U.S. PATENT DOCUMENTS 6,762,134 B1 * 7/2004 Bohn et al. ................. 438/745
6,790,785 B1 * 9/2004 Li et al. ...................... 438/745

FOREIGN PATENT DOCUMENTS

| EP | 1 231 649 A2 | 8/2002 |
| JP | 2000-195835 | 7/2000 |
| JP | 2002-334856 | 11/2002 |

OTHER PUBLICATIONS

P. Gorostiza et al., "First stages of platinum electroless deposition on silicon(100) from hydrogen fluoride solutions studied by AFM," Thin Solid Films 275 (1996) 12-17.
X. Li et al., "Metal-assisted chemical etching $HF/H_2O_2$ produces porous silicon," Applied Physics Letters, vol. 77, No. 16, Oct. 16, 2000.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

Disclosed is a method for producing a multicrystalline silicon substrate for solar cells comprising: a metal deposition step for depositing such metal particles as platinum and silver on the surface of the substrate by electroless-plating chloroplatinic acid or silver perchlorate; a boring step for subjecting the substrate surface to etching in a solution containing at least one of hydrofluoric acid and hydrogen peroxide; and a step for removing a stain layer by immersing the substrate into an alkaline solution. A multicrystalline silicon substrate having a lower reflectance is provided at a lower cost.

8 Claims, 4 Drawing Sheets

10 μm

METHOD FOR PRODUCING MULTICRYSTALLINE SILICON SUBSTRATE FOR SOLAR CELLS

This is a continuation of an International application No. PCT/JP03/07176 having an international filing date of Jun. 6, 2003.

TECHNICAL FIELD

The present invention relates to a method for producing a multicrystalline silicon substrate for solar cells, in particular, to a method for producing a multicrystalline silicon substrate with a low light reflectance.

BACKGROUND ART

It is known that crystalline solar cells in which monocrystalline silicon or multicrystalline silicon is used as a substrate have energy conversion efficiency higher than that of amorphous solar cells. When light reaches the silicon substrate of solar cells, sunlight divides into light entering inside the substrate and light reflecting on the substrate surface. Only the light entering inside contributes to photovoltaic effects.

In conventional crystalline solar cells, selective etching is given to the substrate surface to provide a so-called texture configuration in which multiple pyramids are continuously formed, thereby having improved energy conversion efficiency. This is a configuration utilizing an optical confinement effect in which even light once reflected on the slant plane of the pyramid can be received on the slant plane of the adjacent pyramid and is allowed to be made incident through refraction, unlike a case where the substrate surface is even.

Such a texture configuration of the substrate surface is in general formed by subjecting a substrate having the (100) orientation to anisotropic etching in an alkaline solution, in a case where the substrate is made from monocrystalline silicon. In addition, where a substrate is made from multicrystalline silicon, the orientations individually vary depending on crystal grains, and anisotropic etching may fail to provide an optimal texture configuration to which pyramids are connected, thereby a machining method, reactive ion etching (RIE), isotropic wet etching and others are adopted for decreasing the surface reflection. In the machining method, the surface of a multicrystalline silicon substrate is mechanically grounded down by a dicer into V-shape grooves and then subjected to chemical etching to smooth the V-shaped slant planes, thereby forming a texture configuration. In the RIE method, gases such as $SF_6$, $CF_4$ and $Cl_2$ are introduced into an etching chamber and glow discharge is allowed from a high-frequency power source to provide etching. Isotropic wet etching is a chemical etching using nitric acid and hydrofluoric acid.

However, in the case of monocrystalline silicon solar cells, monocrystalline silicon itself is very expensive, whereas in the case of multicrystalline silicon substrates, from the necessity of machining individually in a machining method, taking too much time in providing many desired grooves is required, resulting in higher production costs. In the RIE method, introduced gases such as $SF_6$, $CF_4$ and $Cl_2$ into an etching chamber are corrosive, therefore, the device must be composed of anti-corrosive materials, resulting in higher costs. Isotropic wet etching provides a textured substrate surface which is 20%, or still high in the reflectance, inferior in energy conversion efficiency and emits a harmful gas of NOx due to the use of nitric acid in the etching solution. By any of the above methods, a serious problem has not been solved where the energy conversion efficiency of multicrystalline silicon solar cells is lower than that of monocrystalline silicon solar cells.

Therefore, an object of the present invention is to provide a multicrystalline silicon substrate having a lower reflectance at a lower cost.

SUMMARY OF THE INVENTION

In order to solve the problem, a method for producing a multicrystalline silicon substrate for solar cells of the invention comprises a metal deposition step wherein metal particles are deposited to the surface of a multicrystalline silicon substrate and a boring step wherein the substrate surface is subjected to etching in a solution containing one or more types of those selected from hydrofluoric acid and hydrogen peroxide.

In this method, the metal particles deposited on the substrate surface act as a catalyst for reducing proton and hydrogen peroxide, and proton or hydrogen peroxide smoothly receives electrons, thereby holes remain inside the substrate. These holes accelerate oxidation of silicon and dissolution in the solution. Where the solution contains hydrofluoric acid, dissolution of silicon will be further accelerated. As a result, a texture surface can be obtained. Since it is easy to array metal particles at a small pitch, the resulting texture surface has a narrow distance between the concavity and the convex parts as well as a great depth of the concavity to provide a low reflectance.

It is preferable for the method of the present invention to provide a step for removing a stain layer by immersing the substrate into an alkaline solution, in addition to the foregoing boring step. The substrate surface obtained immediately after the boring step usually has a stain layer dotted with nano-scale fine holes, which is unfavorable when subsequently forming a pn junction.

It is further preferable that the means for depositing metal particles is electroless plating, because this plating does not need particularly expensive equipment.

Preferable metals include platinum, palladium, gold and silver. Of these metals, platinum derived from chloroplatinic acid and palladium derived from chloropalladic acid are favorable because chloroplatinic acid and chloropalladic acid coexist stably with hydrofluoric acid. Silver is inexpensive among precious metals and can be reused due to easy removal by nitric acid and others, thus leading to reduced production costs. In addition, silver derived from water-soluble silver salts such as silver perchlorate and silver nitrate is preferable because such silver can be easily handled and is also easy in washing after the deposition step. Silver perchlorate is particularly preferable.

Where a plating bath for electroless plating is hydrofluoric acid solution, it is preferable that the concentration of hydrofluoric acid in the foregoing boring step is higher than that of hydrofluoric acid of hydrofluoric acid solution for the plating bath. This is because hydrofluoric acid in the plating bath simply removes the silicon oxidized film on the substrate surface to deposit metal particles, whereas hydrofluoric acid in the boring step needs to etch the substrate in the depth direction.

BEST MODE FOR CARRYING OUT THE INVENTION

[Embodiment 1]

Figure 1:
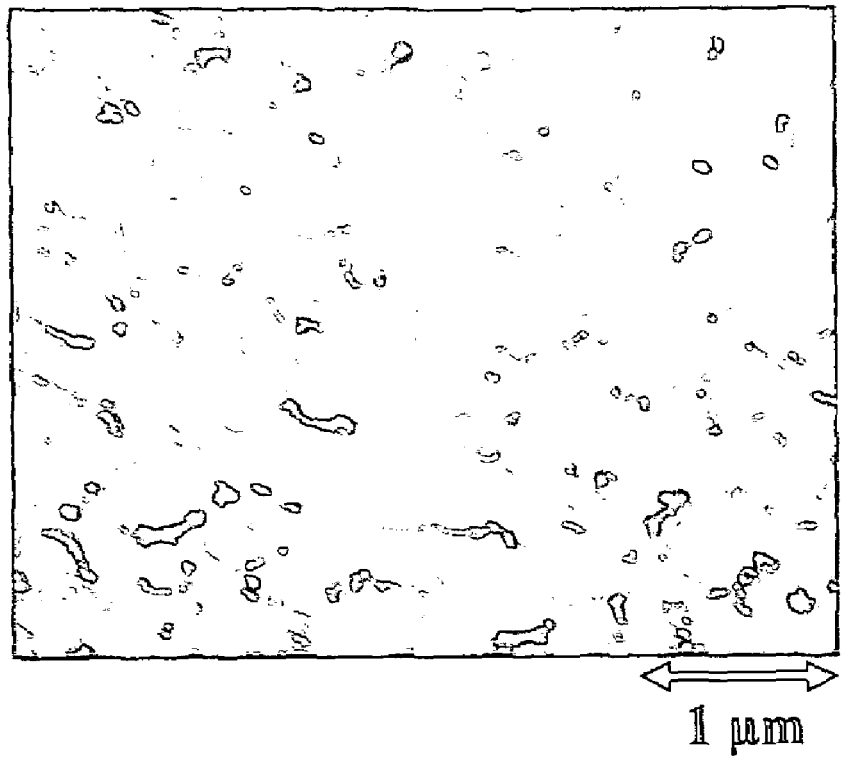
FIG. 1 is an SEM image showing a substrate surface textured according to a method described in Embodiment 1.

The surface of a silicon substrate was textured according to the following order.

(A1) Preparation of silicon substrate: Prepared was boron-doped p-type multicrystalline silicon substrate which was thinly sliced with a mean thickness of 350 μm. The specific resistance was 0.5 to 30 cm.

(A2) Preliminary washing: The above substrate was subjected to 5 minutes of ultrasonic cleaning in acetone and then washed with pure water.

(A3) Deposition of metal particles: After the cleaning, the substrate was immersed into a 12% hydrofluoric acid solution for 2 minutes and then washed with pure water. Thereafter, it was immersed in a mixed solution of 1 mM chloroplatinic acid and 15 mM hydrofluoric acid at 40° C. for 2 minutes, and again washed with pure water.

(A4) Boring: Next, the substrate was immersed into a 12% hydrofluoric acid solution at 25° C. for 24 hours.

(A5) Removal of stain layer: After the substrate was washed with pure water, the pure water on the surface was blown away by a nitrogen gun and then immersed into a 5% ammonia water for 1 minute. Finally, it was washed with pure water and the pure water on the surface was blown away by a nitrogen gun.

[Embodiment 2]

The surface of a silicon substrate was textured according to the following order.

(B1) Preparation of silicon substrate: Prepared was a multicrystalline silicon substrate which was the same in shape and quality as that used in Embodiment 1.

(B2) Recovery of damage: The above substrate damaged in slicing was recovered by subjecting alkaline etching by approximately 10 μm from the surface.

(B3) Preliminary washing: The substrate was immersed into a mixed solution consisting of 96% sulfuric acid and 30% hydrogen peroxide by a ratio of 1:1 for 10 minutes of washing.

(B4) Removal of oxidized film: The substrate was immersed into a 2% hydrofluoric acid solution for 1 minute to remove an oxidized film formed during Preliminary washing.

(B5) Deposition of metal particles: The substrate was immersed into an aqueous solution containing $10^{-4}$M silver perchlorate $AgClO_4$ and $10^{-3}$M sodium hydroxide NaOH at 20 to 30° C. for 10 minutes to precipitate silver particles on the substrate surface. Then, the substrate was washed with pure water.

(B6) Boring: The substrate was immersed into a mixed solution consisting of 10% hydrofluoric acid and 30% hydrogen peroxide by the ratio of 10:1 at 20 to 30° C. for 5 minutes.

(B7) Removal of stain layer: The substrate was immersed into a 1% sodium hydroxide (NaOH) solution at 20 to 30° C. for 10 minutes, and then rinsed in water.

(B8) Removal of silver: The substrate was immersed into a 60% nitric acid for 5 minutes and then rinsed in water.

(B9) Removal of oxidized film: The substrate was immersed into a 10% hydrofluoric acid aqueous solution for 1 minute to remove the oxidized film formed during removal of silver. Finally, the substrate was washed with pure water and the pure water on the surface was blown away by a nitrogen gun.

[Comparative example]

A silicon substrate was treated similarly as in Embodiment 2, except for the procedures in the order of (R1) to (R3) in place of those of (B3) to (B9) in Embodiment 2.

(R1) Preliminary washing: The above substrate was subjected to 5 minutes of ultrasonic cleaning in acetone and then washed with pure water.

(R2) Isotropic etching: The substrate was immersed in a mixed solution consisting of 50% hydrofluoric acid, 69% nitric acid and pure water (volume ratio of 20:1:10) at 20 to 30° C. for 420 seconds.

(R3) Removal of stain layer: After the substrate was washed with pure water, the pure water on the surface was blown away by a nitrogen gun and then immersed into a 5% ammonia water for 1 minute. Finally, the substrate was washed with pure water and the pure water on the surface was blown away by a nitrogen gun.

[Evaluation]

Figure 2:
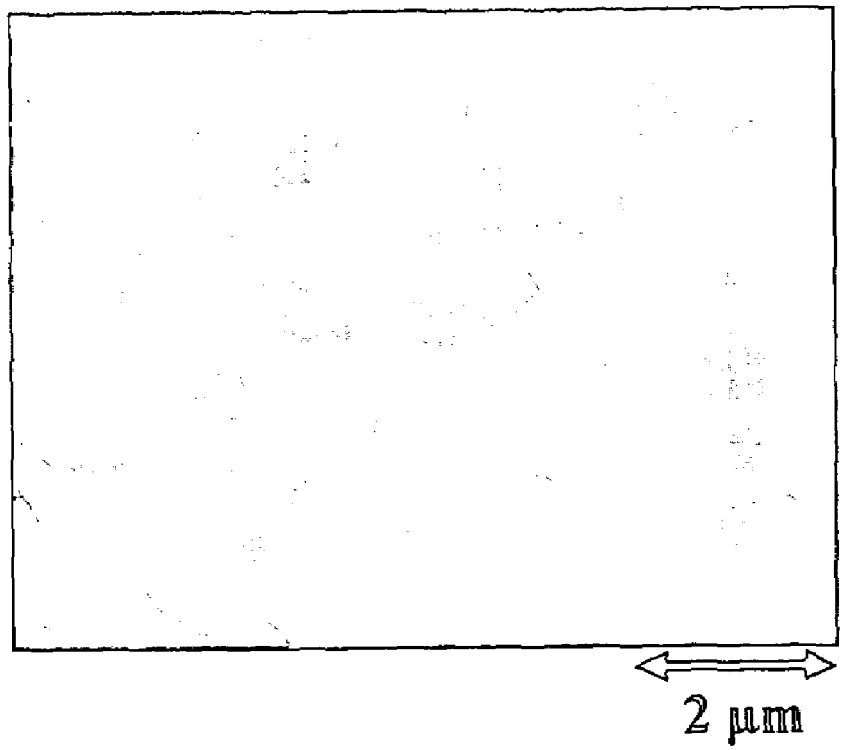
FIG. 2 is an SEM image showing the substrate surface textured according to a method described in Embodiment 2.
Figure 3:
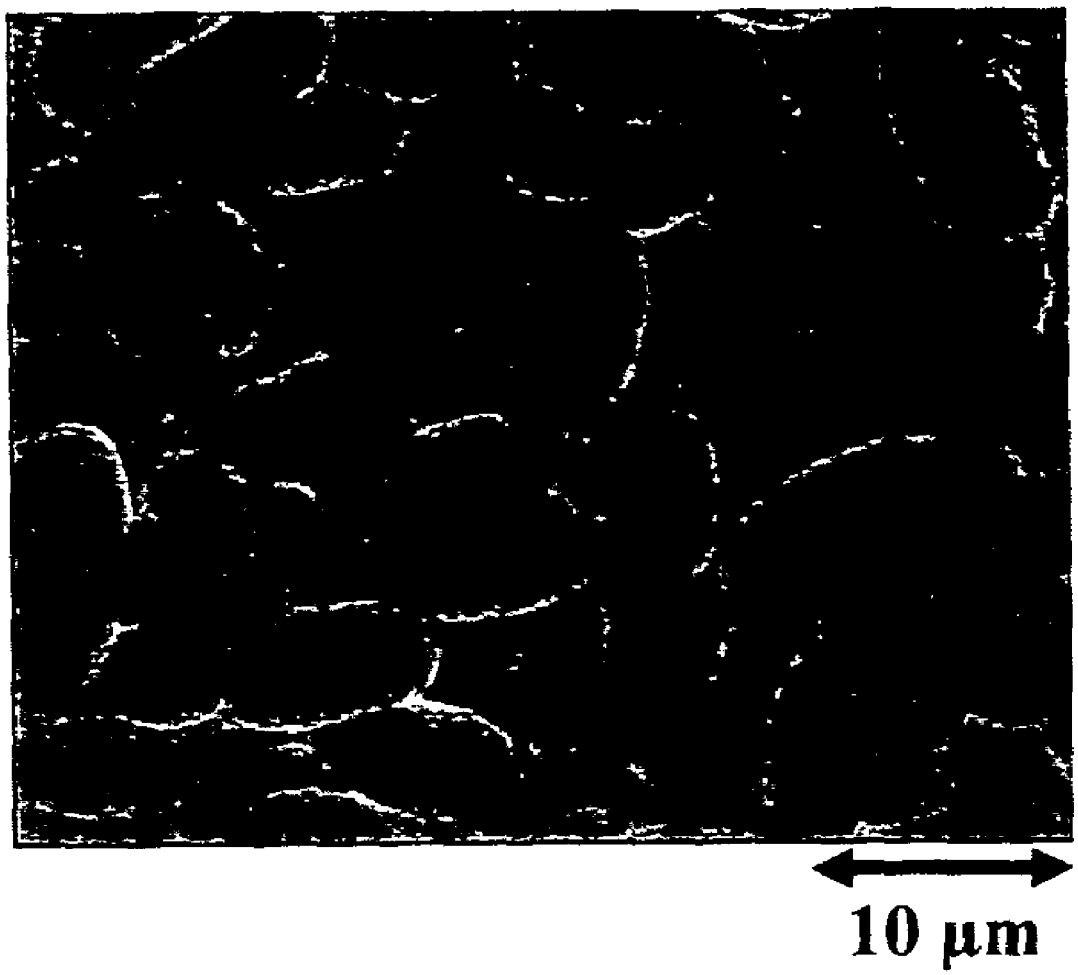
FIG. 3 is an SEM image showing a substrate surface textured according to a method described in a Comparative example.

Textured surfaces of these substrates were observed by a scanning electron microscope (SEM) to obtain the results shown in FIG. 1, FIG. 2 and FIG. 3. These are images respectively showing the substrate surfaces textured according to Embodiment 1, Embodiment 2 and Comparative example, in which a white part shows a convex part and a black part shows a concavity in all the figures. In Embodiments 1 and 2, as shown in FIG. 1 and FIG. 2, the textured surfaces in which the convex part is steep in an erect fashion and the concave part is deep were formed. As for details, refer to FIG. 1 and FIG. 2. The diameter of the concave part was 1 to 2 μm in Embodiment 1 and approximately 0.5 μm in Embodiment 2. In contrast, in the Comparative example as shown in FIG. 3, the convex part was smooth and the concave part was shallow, of which the diameter was approximately 10 μm.

Figure 4:
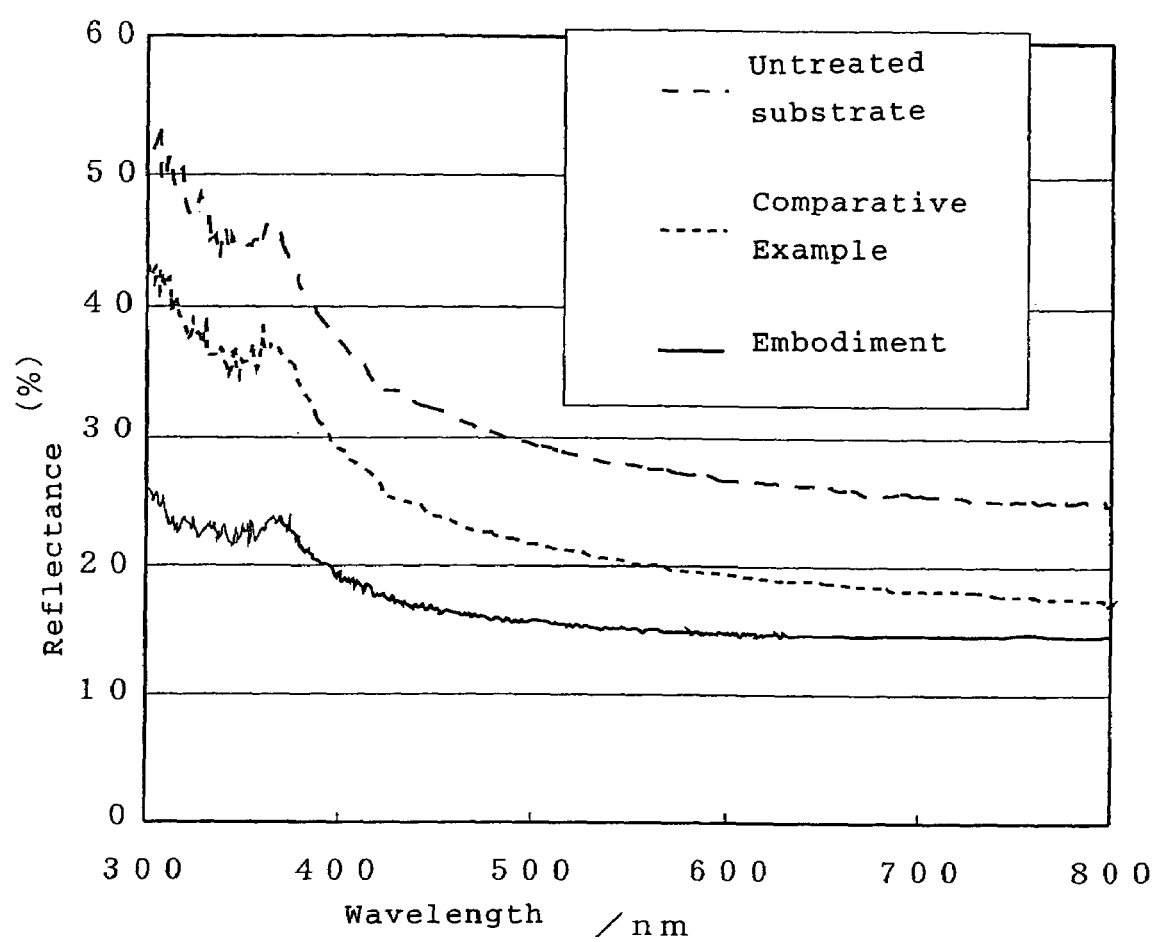
FIG. 4 is a graph showing results obtained by measuring reflectance for the substrate surfaces of Embodiment 1, the Comparative example and the untreated substrate.
Figure 5:
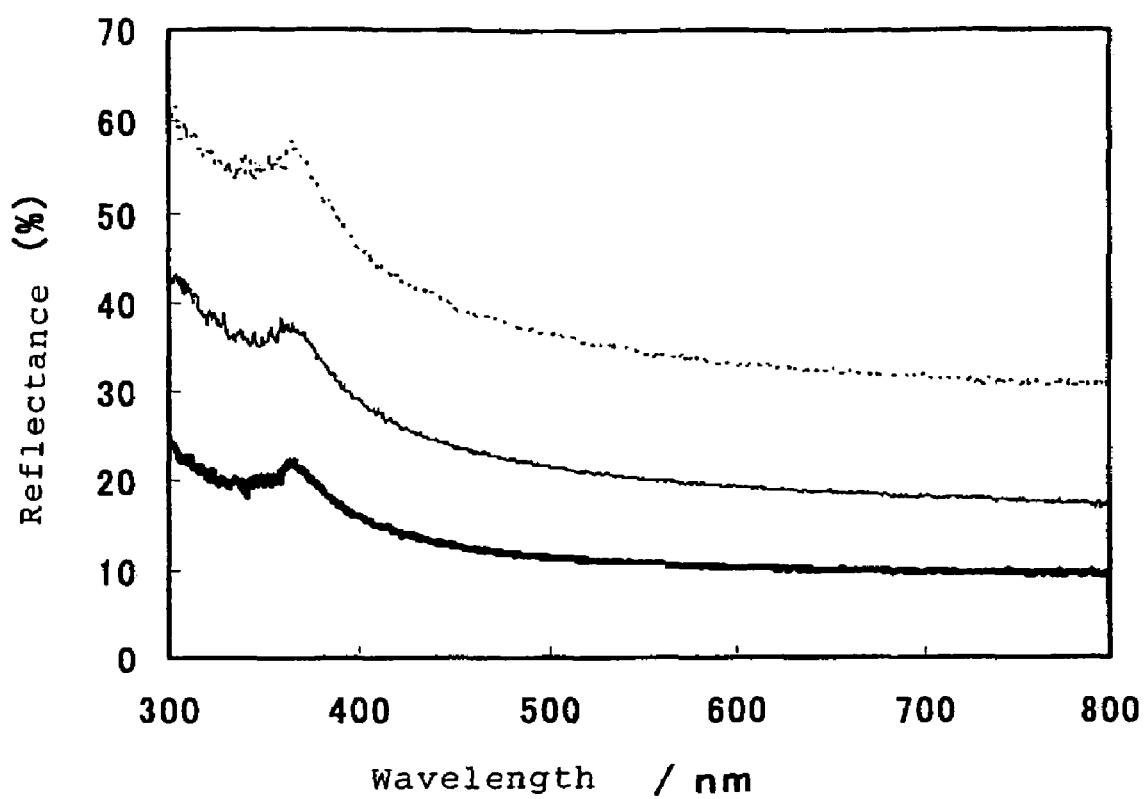
FIG. 5 is a graph showing results obtained by measuring reflectance for the substrate surfaces of Embodiment 2, the Comparative example and the untreated substrate.

The textured substrates were measured for the reflectance at wavelengths from 300 nm to 800 nm by using an ultraviolet-visible spectrophotometer (UV-2500PC made by Shimadzu Corporation) and an integrating sphere for measuring reflection spectra. Similarly measured was the untreated substrate to which the procedures of (A1) and thereafter in the above Embodiment 1 were not given, as a control. FIG. 4 shows results obtained in Embodiment 1, Comparative example and the untreated substrate. FIG. 5 shows results obtained in Embodiment 2, the Comparative example and the untreated substrate. In FIG. 5, the bold line, thin solid line and dotted line represent Embodiment 2, the Comparative example and control, respectively. As shown in FIG. 4 and FIG. 5, the substrates were textured according to Embodiment 1 or 2, thereby significantly reducing the reflectance more than the Comparative example and, as a matter of course, more than the untreated substrate.

INDUSTRIAL APPLICABILITY

According to the present invention, the surface of a multicrystalline silicon substrate can be optimally textured at a lower cost, and therefore, it is advantageous in producing solar cells.

What is claimed is:

1. A method for producing a multicrystalline silicon substrate for solar cells comprising the steps of;
   depositing metal particles on the surface of a multicrystalline silicon substrate;
   subjecting the substrate surface to etching in a solution containing one or more of hydrofluoric acid and hydrogen peroxide; and
   removing a stain layer by immersing the substrate into an alkaline solution.

2. The method as set forth in claim 1, wherein the deposition is performed by electroless plating.

3. The method as set forth in claim 1, wherein the metal is one or more metal selected from the group consisting of platinum, palladium, gold and silver.

4. The method as set forth in claim 1, wherein the solution contains hydrogen peroxide and the metal is platinum or palladium.

5. The method as set forth in claim 4, wherein the platinum and palladium are derived from chloroplatinic acid and chloropalladic acid, respectively.

6. The method as set forth in claim 1, wherein the solution contains hydrofluoric acid and the metal is silver.

7. The method as set forth in claim 6, wherein the silver is derived from a water-soluble silver salt.

8. The method as set forth in claim 1, wherein the solution is a mixed solution of hydrogen peroxide and hydrofluoric acid.

* * * * *

UNITED STATES PATENT AND TRADEMARK OFFICE
CERTIFICATE OF CORRECTION

PATENT NO. : 7,135,414 B2  
APPLICATION NO. : 11/002657  
DATED : November 14, 2006  
INVENTOR(S) : Matsumura et al.

Page 1 of 1

It is certified that error appears in the above-identified patent and that said Letters Patent is hereby corrected as shown below:

Title Page, Item (75) Inventor is corrected to read:  
-- Michio Matsumura, Toyonaka (JP);  
    Kazuya Tujino, Toyonaka (JP);  
    Shinji Yae, Himeji (JP);  
    Hitoshi Matsuda, Himeji (JP) --.

Signed and Sealed this  
Sixth Day of October, 2015

Michelle K. Lee  
*Director of the United States Patent and Trademark Office*